US009059127B1

(12) United States Patent
Lamorey et al.

(10) Patent No.: US 9,059,127 B1
(45) Date of Patent: Jun. 16, 2015

(54) PACKAGES FOR THREE-DIMENSIONAL DIE STACKS

(71) Applicant: International Business Machines Corporation, Armonk, NY (US)

(72) Inventors: Mark C. Lamorey, Williston, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/151,156

(22) Filed: Jan. 9, 2014

(51) Int. Cl.

| | |
|---|---|
| ***H01L 23/495*** | (2006.01) |
| ***H01L 23/10*** | (2006.01) |
| ***H01L 23/34*** | (2006.01) |
| ***H01L 23/367*** | (2006.01) |
| ***H01L 23/36*** | (2006.01) |
| ***H01L 25/065*** | (2006.01) |

(52) U.S. Cl.
CPC ............ *H01L 23/3672* (2013.01); *H01L 23/36* (2013.01); *H01L 25/0657* (2013.01)

(58) Field of Classification Search
CPC ............ H01L 23/36; H01L 2023/4043; H01L 2023/405; H01L 2023/4056
See application file for complete search history.

(56) References Cited

U.S. PATENT DOCUMENTS

| | | | |
|---|---|---|---|
| 8,053,873 | B2 | 11/2011 | Chauhan et al. |
| 8,445,918 | B2 | 5/2013 | Bartley et al. |
| 8,482,134 | B1 | 7/2013 | Darveaux et al. |
| 2009/0311826 | A1 | 12/2009 | Bernstein et al. |
| 2010/0213600 | A1 | 8/2010 | Lau et al. |
| 2011/0024888 | A1 | 2/2011 | Pagaila et al. |
| 2011/0101349 | A1 | 5/2011 | Oda |
| 2012/0025388 | A1 | 2/2012 | Law et al. |
| 2012/0061804 | A1 | 3/2012 | Kaskoun et al. |
| 2012/0074559 | A1 | 3/2012 | Budell et al. |
| 2012/0106117 | A1 | 5/2012 | Sundaram et al. |
| 2013/0082365 | A1 | 4/2013 | Bernier et al. |
| 2014/0084441 | A1* | 3/2014 | Chiu ............................ 257/692 |

OTHER PUBLICATIONS

"Effect of system components on electrical and thermal characteristics for power delivery networks in 3D system integration" Jianyong Xie; Daehyun Chung; Swaminathan, M.; McAllistter, M.; Deutsch, A.; Lijun Jiang; Rubin, B.J. Electrical Performance of Electronic Packaging and Systems, 2009. EPEPS '09. IEEE 18th Conference on pp. 113-116.

(Continued)

*Primary Examiner* — Hoai V Pham
(74) *Attorney, Agent, or Firm* — Wood, Herron & Evans, LLP; Anthony J. Canale

(57) ABSTRACT

Packages for a three-dimensional die stack, methods for fabricating a package for a three-dimensional die stack, and methods for distributing power in a package for a three-dimensional die stack. The package may include a first lid, a second lid, a die stack located between the first lid and the second lid, a first thermal interface material layer between the first lid and a first die of the die stack, and a second thermal interface material layer between the second lid and the second die of the die stack. The second thermal interface material layer is comprised of a thermal interface material having a high electrical conductivity and a high thermal conductivity.

13 Claims, 5 Drawing Sheets

(56) References Cited

OTHER PUBLICATIONS

"Evolution, challange, and outloook of TSV, 3D IC integration and 3d silicon integration" Lau, J.H. Advanced Packaging Materials (APM), 2011 International Symposium on; Publication Year: 2001, pp. 462-488 Digital Object Identifier: 10.1109/ISAPM.2011.6105753.

"Novel crosstalk modeling for multiple through-silicon-vias (TSV) on 3-D IC: Experimental validation and application to Faraday cage design" Yu-Jen Chang; Hao-Hsiang Chuang; Yi-Chang Lu; Yih-Peng Chiou; Tzong-Lin Wu; Peng-Shu Chen; Shih-Hsien Wu; Tzu-Ying Kuo; Chau-Jie Zhan; Wei-Chung Lo Electrical Performance of Electronic Packaging and Systems (EPEPS). 2012 IEEE 21st Conference on pp. 232-235.

* cited by examiner

PACKAGES FOR THREE-DIMENSIONAL DIE STACKS

BACKGROUND

The invention generally relates to semiconductor manufacturing and, more particularly, to packages for three-dimensional die stacks, methods for fabricating a package for a three-dimensional die stack, and methods for distributing power in a package for a three-dimensional die stack.

Die stacks arrange the constituent chips or dies in a compact three-dimensional stack characterized by multiple tiers. The functionality of a die stack requires functionality of each individual die. The stacked arrangement of the three-dimensional integration conserves space and shortens signal transmission distances for inter-die communications, which may improve both efficiency and performance of the die stack. During manufacture, each die is processed independently to form integrated circuits. The different dies are subsequently stacked in a three-dimensional arrangement and bonded so that the dies are vertically arranged with permanent attachment to each other.

Improved packages for a three-dimensional die stack, methods for fabricating a package for a three-dimensional die stack, and methods for distributing power in a package for a three-dimensional die stack are needed.

SUMMARY

In an embodiment of the invention, a package includes a first lid, a second lid, a die stack located between the first lid and the second lid, a first thermal interface material layer between the first lid and a first die of the die stack, and a second thermal interface material layer between the second lid and the second die of the die stack. The second thermal interface material layer is comprised of a thermal interface material that has a high electrical conductivity and a high thermal conductivity.

In an embodiment of the invention, a package includes a first substrate with a first surface, a second surface, and a through-hole extending from the first surface to the second surface. The package further includes a conductive layer with a first portion on the first surface, a second portion on the second surface, and a third portion inside the through-hole and coupling the first portion with the second portion. A first die of a die stack is positioned adjacent to the first surface of the first substrate. The first die is coupled with the first portion of the conductive layer. The package further includes a second substrate adjacent to the second surface of the first substrate. The second substrate has a power plane coupled with the second portion of the conductive layer.

In an embodiment of the invention, a package includes a substrate with a through-hole, and a die stack including a first die positioned outside of the through-hole in the substrate and a second die positioned inside of the through-hole in the substrate. Conductive features extend through the thickness of the first die, and conductive features extend through the thickness of the second die. The conductive features of the second die are proximate to its outer perimeter. The conductive features of the first die and the second die are coupled with electrical ground.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
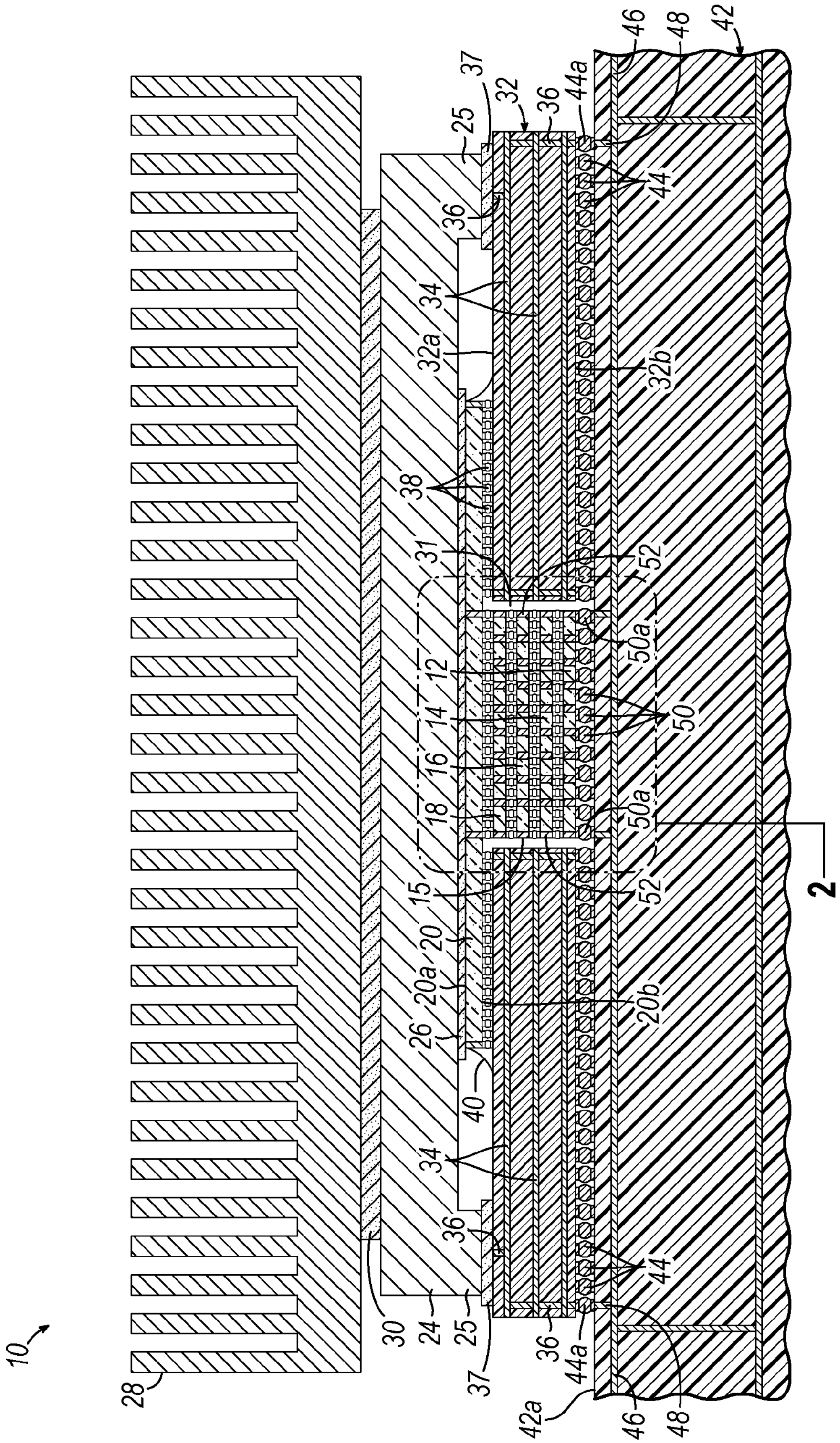
FIG. 1 is a cross-sectional view of a package for a die stack in accordance with an embodiment of the invention.
Figure 3:
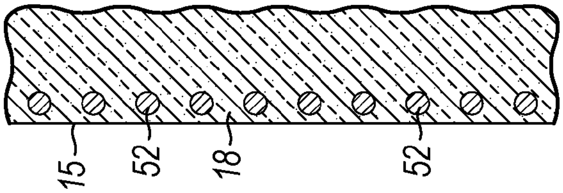
FIG. 3 is cross-sectional view taken generally along line 3-3 in FIG. 2.
Figure 2:
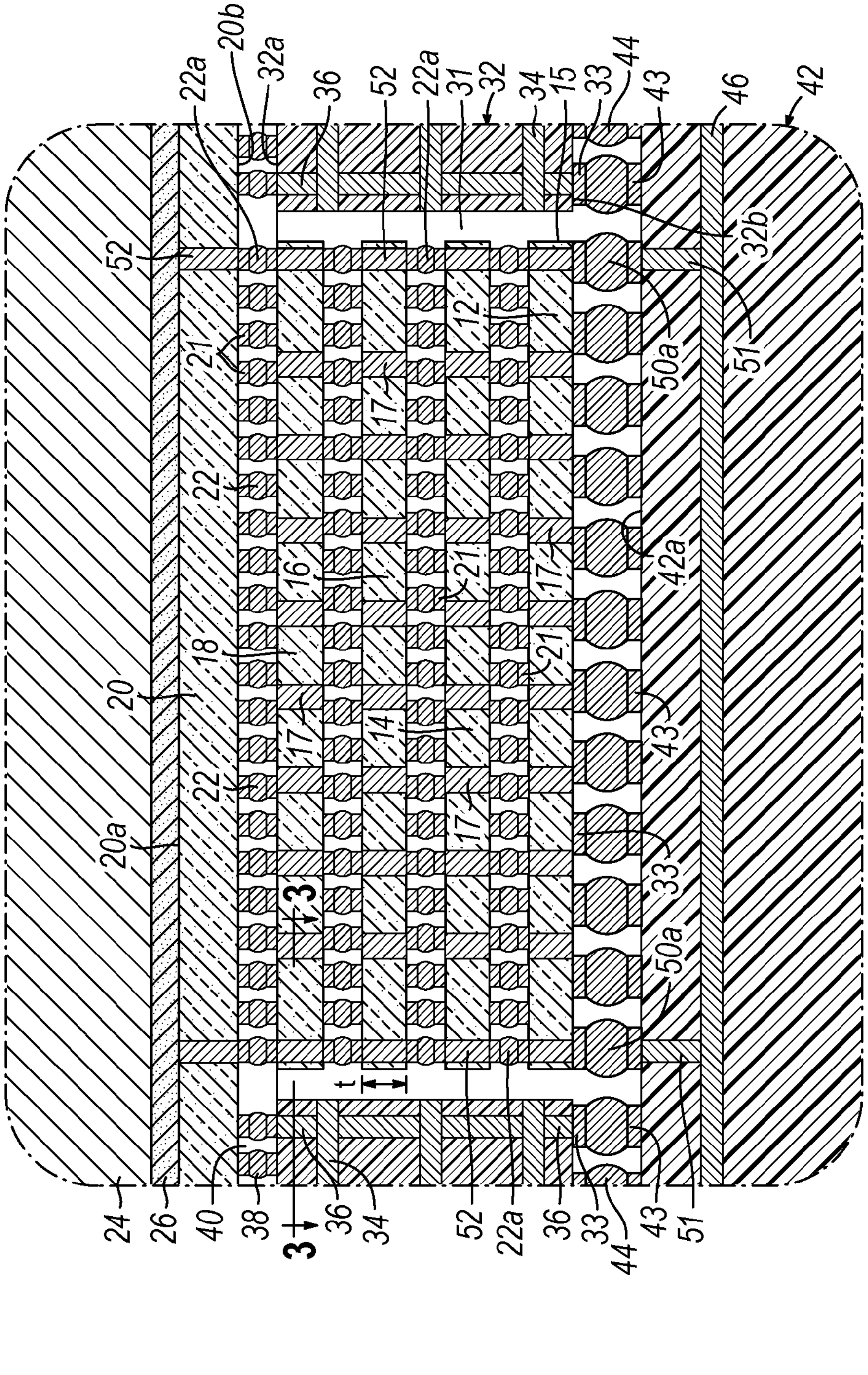
FIG. 2 is an enlarged cross-sectional view of a portion of the package of FIG. 1.

With reference to FIGS. 1-3 and in accordance with an embodiment of the invention, a package 10 includes plurality of chips or dies 12, 14, 16, 18, 20 arranged in a vertical stack to define a die stack. Adjacent pairs of the dies 12, 14, 16, 18, 20 are joined in a face-to-face fashion by solder balls 22 that are reflowed to be coupled with respective bond pads 21. In the representative embodiment, the dimensions of die 20 are greater than the dimensions of dies 12, 14, 16, 18, which may be of comparable size. Die 12 is vertically located at an opposite end of the die stack from die 20.

Each of the dies 12, 14, 16, 18, 20 in the die stack comprises one or more integrated circuits fabricated with a front-end-of-line process, such as a complementary metal-oxide-semiconductor (CMOS) process, using a portion of a semiconductor wafer. The dies 12, 14, 16, 18, 20 may be fabricated with different technology nodes (130 nm, 90 nm, 65 nm, 45 nm, etc.), or may be characterized by a specific circuitry type (RF, analog, photonic, memory, MEMS, digital, etc.). In one embodiment, the die 20 may be a custom logic or processor chip and each of the dies 12, 14, 16, 18 may be a memory chip, such as a dynamic access memory chip, that are stacked with die 20. The stacked arrangement may improve performance, bandwidth, and/or functionality.

Each of the dies 12, 14, 16, 18, 20 may also comprise an interconnect structure fabricated with middle-end-of-line and back-end-of-line processes. Each interconnect structure is configured to communicate signals to and from the integrated circuits on each of the dies 12, 14, 16, 18, 20 and to provide power and ground connections for the integrated circuits. Extending through the thickness, t, of each of the dies 12, 14, 16, 18, 20 are conductive features 17, which may comprise through silicon vias (TSVs). The thicknesses, t, of the dies 12, 14, 16, 18, 20 may vary, and the conductive features 17 may only extend through the semiconductor wafer portion and yet be considered to extend through the respective die. The conductive features 17, in conjunction with the interconnect structure, couple bond pads 21 on opposite top and bottom sides of each of the dies 12, 14, 16, 18, 20 to define continuous conductive paths.

The package 10 further includes a lid 24, a heat sink 28, a substrate in the representative form of a laminate substrate 32, and a substrate in the representative form of a printed circuit board 42 that are assembled with the die stack. The lid 24 is coupled with a confronting surface 20*a* of the die 20 by a first-level thermal interface material layer 26. The lid 24 is comprised of an electrically conductive and thermally conductive material, such as copper coated with nickel. The heat sink 28 is coupled with a confronting surface of the lid 24 by a second-level thermal interface material layer 30. The thermal interface material layers 26, 30 may be effective to reduce the contact resistance between the mating heat-generating and heat-sinking units by filling micro-gaps located between the mating surfaces. The lid 24 operates as a heat spreader that conducts heat generated by the dies 12, 14, 16, 18, to the heat sink 28. The thermal interface material layers 26, 30 may also function as heat spreaders.

The thermal interface material layers 26, 30 may be comprised of a thermal adhesive, a thermal grease, a thermal gel, a phase change material, a thermal pad, or a combination thereof. The material(s) comprising the thermal interface material layers 26, 30 are thermally conductive and may also be electrically conductive. The thermal resistance of the thermal interface material layers 26, 30 may depend upon, among other factors, contact resistance, bulk thermal conductivity, and layer thickness.

The laminate substrate 32 may include levels of a ground plane 34 and ground vias 36 interconnecting the different levels of the ground plane 34. The lid 24 may include a flange 25 at its edges that is mechanically coupled by a conductive adhesive layer 37 with a surface 32*a* of the laminate substrate 32. The attachment of the flange 25 with the laminate substrate 32 adds mechanical strength to the package 10. The conductive adhesive layer 37 also electrically couples the lid 24 with the ground plane 34 of the laminate substrate 32 via ground vias 36 accessible at the surface 32*a* of the laminate substrate 32.

The dies 12, 14, 16, 18 are positioned inside of a through-hole 31 extending through the laminate substrate 32 from surface 32*a* of laminate substrate 32 to surface 32*b* of laminate substrate 32. Die 12 is located proximate to one open end of the through-hole 31 and die 18 is located proximate to an opposite open end of the through-hole 31. The die 20 is positioned outside of the through-hole 31 and adjacent to surface 32*a* of the laminate substrate 32. Reflowed solder balls 38 couple bond pads 21 on the surface 20*b* of the die 20 with corresponding bond pads 33 on the surface 32*a* of the laminate substrate 32. Solder balls 22 on die 18 attach dies 12, 14, 16, 18 as an assembly to the surface 20*b* of die 20, which is the same surface 20*b* of die 20 that is proximate to the through-hole 31 in the laminate substrate 32 and that carries solder balls 22.

An underfill 40 may be applied that fills the open space in the gap between the die 20 and the laminate substrate 32 that is not filled by the solder balls 38, and may include a filet at the edges of the die 20. The underfill 40 protects the reflowed solder balls 38 against various adverse environmental factors, redistributes mechanical stresses due to shock, and prevents the solder balls 38 from moving under strain during thermal cycles when the chip stack of the package 10 is operating in an end use device.

The printed circuit board 42 is positioned adjacent to the surface 32*b* of the laminate substrate 32. The printed circuit board 42 includes bond pads 43 at surface 42*a* that are coupled with bond pads 33 at a surface 32*b* of the laminate substrate 32 by reflowed solder balls 44. The printed circuit board 42 also includes a ground plane 46 that is coupled with the ground plane 34 of the laminate substrate 32 by ground vias 48 accessible at surface 42*a* and specific solder balls 44*a* from among the reflowed solder balls 44. The solder balls 44*a*, the ground vias 48 in the printed circuit board 42, and the ground vias 36 in the laminate substrate 32 are located at or proximate to the outer periphery of the laminate substrate 32. As a result, the lid 24 is coupled with the ground plane 46 of the printed circuit board 42 in a closed circuit path that includes the conductive adhesive layer 37, the ground plane 34 and ground vias 36 of the laminate substrate 32, and the solder balls 44*a* and ground vias 48. Bond pads 21 on the die 12 may be coupled with bond pads 43 on the printed circuit board 42 by reflowed solder balls 50, which may be C4 solder balls.

A plurality of conductive features 52 are formed in each of the dies 12, 14, 16, 18, 20. The conductive features 52, which are similar or identical to conductive features 17, may be located in regions of the active area of dies 12, 14, 16, 18, 20 designated to be free of active devices such as field-effect transistors, of the associated integrated circuit. The conductive features 52 in the dies 12, 14, 16, 18 are positioned adjacent to an outer perimeter 15 of each die, as best shown in FIG. 3, and may be aligned in rows. The conductive features 52 may be located along each of the edges constituting the outer perimeter of each of the dies 12, 14, 16, 18 so as to surround the implicated die. The conductive features 52 are formed adjacent to the kerf removed when the dies 12, 14, 16, 18 are singulated (i.e., separated from each other) by a dicing operation from the production wafer and the outer perimeter 15 may be defined by singulation of the dies 12, 14, 16, 18.

In one embodiment, the conductive features 52 comprise through silicon vias (TSVs) that extend through the thickness of the substrate of each of the dies 12, 14, 16, 18, 20. The TSVs comprising the conductive features 52 may be fabricated by deep reactive ion etching or laser drilling a deep via into the substrate, electrically insulating the deep via, lining the via with a conductive liner that is a diffusion barrier and/or adhesion promoter, and filling the via with a metal (e.g., copper, tungsten). The substrate may be thinned from the back side by a wet or dry etch to reduce its original thickness and thereby expose the metal of each TSV.

The conductive features 52 of adjacent pairs of the dies 12, 14, 16, 18, 20 are coupled by specific solder balls 22*a* from among the solder balls 22 and the corresponding bond pads 21. With respect to dies 12, 14, 16, 18 and because of the location of the conductive features 52, the solder balls 22*a* are also located near the outer perimeter 15 of each die. Specific solder balls 50*a* from among solder balls 50 and ground vias 51 of the printed circuit board 42 couple bond pads 21 on die 12 with the ground plane 46 of the printed circuit board 42.

The solder balls 50*a* are dedicated to coupling the conductive features 52 in the dies 12, 14, 16, 18 with the ground plane 46 of the printed circuit board 42. The conductive features 52 of die 20 are coupled by the thermal interface material layer 26 with the lid 24, which in turn is coupled with the ground plane 46 of the printed circuit board 42 as discussed above. As a result, the conductive features 52 of the dies 12, 14, 16, 18, 20 are coupled from above and from below with electrical ground.

The die stack of the package 10 features relatively short paths of grounding. The shielding contributed by the conductive features 52 is created proximate to the source of electromagnetic interference (EMI) radiation, namely the dies 12, 14, 16, 18. The EMI radiation is captured by the arrangement of conductive features before the EMI radiation can escape from the package 10 to other components on the printed circuit board 42 or to the exterior of a system box housing the printed circuit board 42. In effect, the conductive features 52 define a three-dimensional Faraday cage about a periphery of the dies 12, 14, 16, 18 that provides a shield for EMI control.

Figure 4:
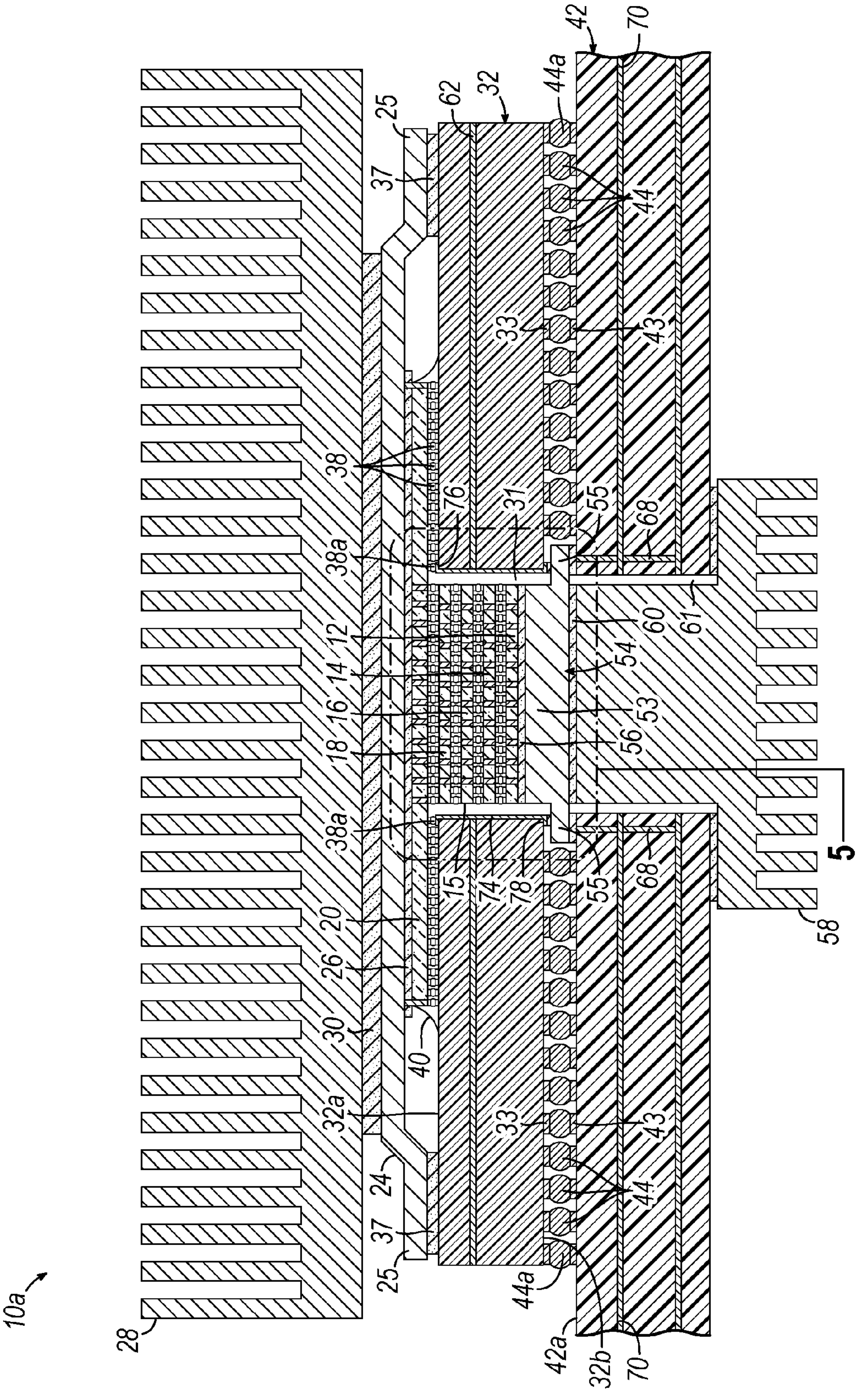
FIG. 4 is a cross-sectional view of a package for a die stack in accordance with an embodiment of the invention.
Figure 5:
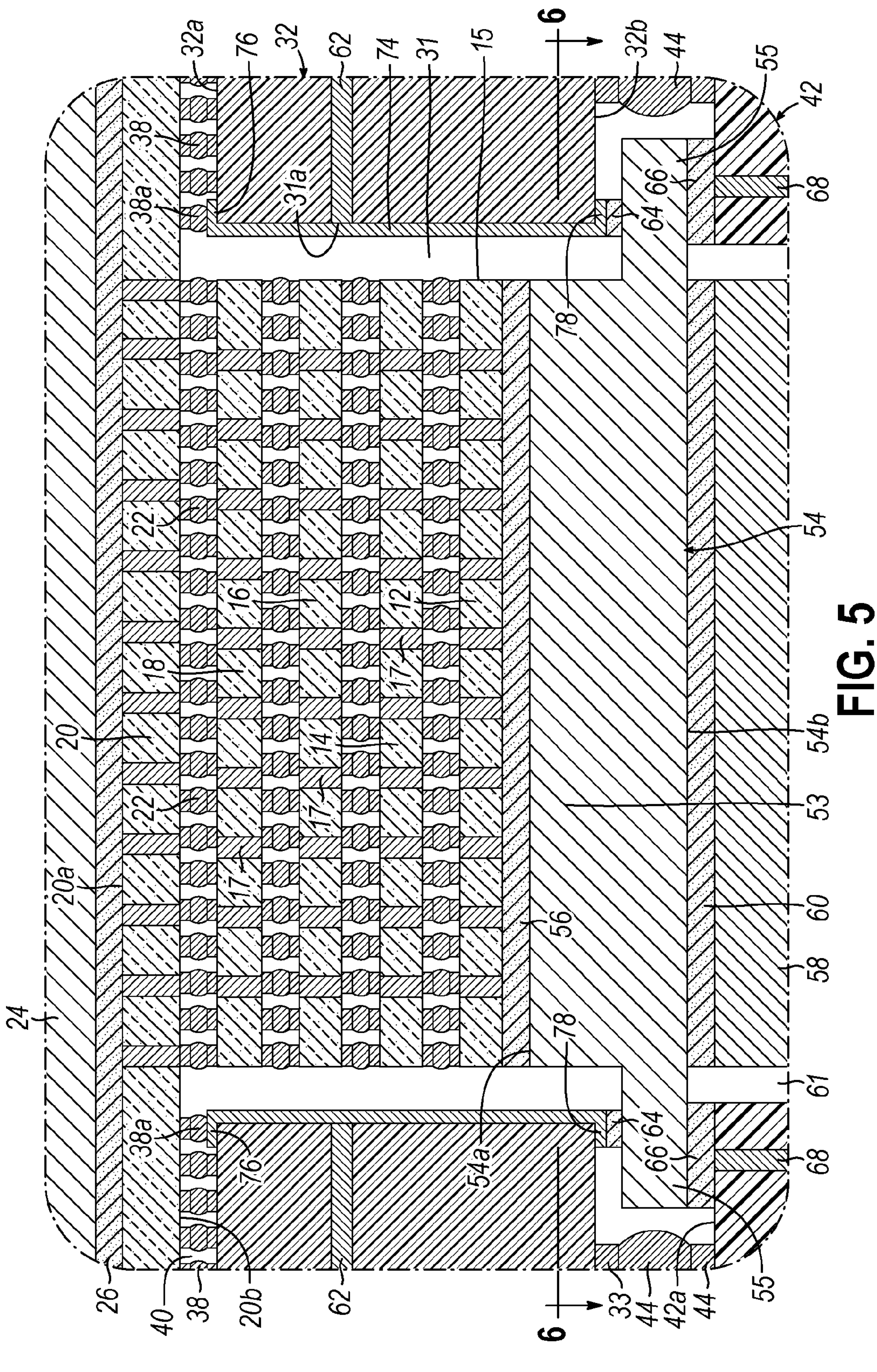
FIG. 5 is an enlarged cross-sectional view of a portion of the package of FIG. 4.
Figure 6:
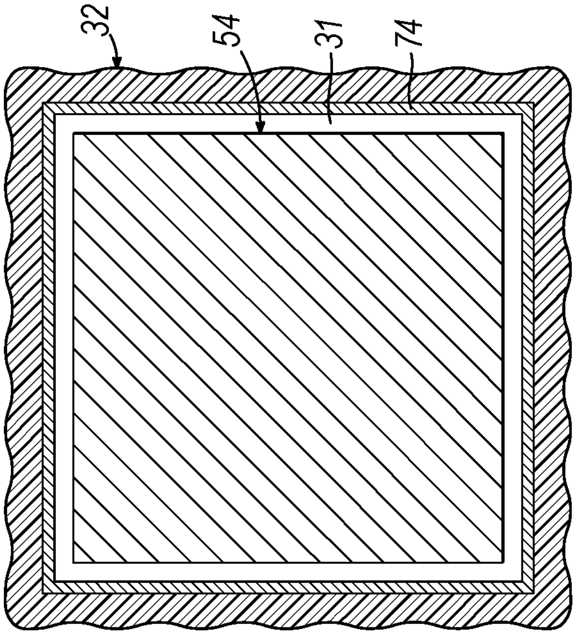
FIG. 6 is cross-sectional view taken generally along line 6-6 in FIG. 5.

With reference to FIGS. 4-6 in which like reference numerals refer to like features in FIGS. 1-3 and in accordance with an embodiment of the invention, a package 10*a* includes a through-hole 61 that extends through printed circuit board 42 and communicates with one end of the through-hole 31 extending through the laminate substrate 32. The throughholes 31, 61, which are each open-ended, may be centrally located in the laminate substrate 32 and the printed circuit board 42, respectively, and may be aligned along a common centerline.

A lid 54 has a surface 54*a* that is coupled with a confronting surface of the die 12 by a thermal interface material layer 56. A heat sink 58 is coupled by a thermal interface material layer 60 with a surface 54*b* of the lid 54. Similar to lid 24, the lid 54 is comprised of an electrically conductive and thermally conductive material, such as copper coated with nickel.

The thermal interface material layers 56, 60 may be similar in function and composition to the thermal interface material layers 26, 30. However, the thermal interface materials comprising the thermal interface material layers 56, 60 should have a high electrical conductivity and a low thermal resistance (i.e., high thermal conductivity). In one embodiment, the thermal conductivity through the thickness of the thermal interface material layers 56, 60 may be on the order of 1 W/mK to 10 W/mK and the electrical conductivity may be on the order of $10^{-5}$ ohm-cm to $10^{-6}$ ohm-cm.

The lid 54 includes a pedestal 53 positioned partially inside through-hole 31 and a flange 55 that projects laterally from the pedestal 53 into the gap between the laminate substrate 32 and the printed circuit board 42 resulting from the solder balls 44 coupling the laminate substrate 32 with the printed circuit board 42. The depth of the pedestal 53 is selected so that the pedestal 53 can be tightly coupled to the die 12 while minimizing the thickness of the thermal interface material layer 56 so as to achieve a high thermal performance path.

The dies 12, 14, 16, 18, 20 represent heat sources that generate heat energy when energized and operating an end use device, and that are also thermally coupled together as a heat-generating system. Heat is transferred in multiple directions from the dies 12, 14, 16, 18, 20, as opposed to a single direction, for dissipation. The lid 24 and heat sink 28 provide one primary path in one direction to dissipate heat generated by the dies 12, 14, 16, 18, 20. The lid 54 and heat sink 58 provide an independent and distinct primary path in an opposite direction to dissipate heat generated by the dies 12, 14, 16, 18, 20. Specifically, the lid 54 cooperates with the thermal interface material layers 56, 60 to conduct heat generated by the dies 12, 14, 16, 18, 20 in a conduction path from die 12 to the heat sink 58.

The junction temperature of die 12, which is located at the bottom of the die stack, may receive the most significant reduction due to the proximity to the lid 54 and heat sink 58. Heat generated by die 12 does not have to be transferred through the other dies 14, 16, 18, 20 to the lid 24 and heat sink 28 in order to be dissipated, but can instead be dissipated by the lid 54 and heat sink 58. The direct dissipation of heat from die 12 also reduces the heat flow from die 12 to the other dies 14, 16, 18, 20 in the die stack. Heat generated by the other dies 14, 16, 18, 20 can also be transferred to the lid 54 and heat sink 58. As a result of the multi-directional heat dissipation capability, the power dissipation in the die stack can be increased or the specification of junction temperature limit of the dies 12, 14, 16, 18, 20 can be lowered in order to achieve a targeted performance, bandwidth, and/or functionality.

In addition to the enhanced heat dissipation from the die stack, the package 10*a* may also provide enhanced power distribution to the die stack.

The flange 55 of the lid 54 is attached to surface 32*b* of the laminate substrate 32 with a conductive connection 64 that has a high electrical conductivity. An opposite side of the flange 55 is attached to the confronting surface 42*a* of printed circuit board 42 with a conductive connection 66 that likewise has a high electrical conductivity. The conductive connections 64, 66 may each be comprised of, for example, a bead of an electrically-conductive epoxy. Dedicated power vias 68 in the printed circuit board 42 couple the conductive connection 66 with a power plane 70 of the printed circuit board 42.

Some of the conductive features 17 on die 12 may be coupled by the thermal interface material layer 56, which is electrically conductive, with the lid 54, which is also coupled by the conductive connection 66 and power vias 68 with the power plane 70 in the printed circuit board 42. The thermal interface material layer 56 conducts power to conductive features 17 of die 12, which then distributes the power through the bond pads 21, solder balls 22, BEOL interconnect structure, and conductive features 17 to the other die 14, 16, 18. Die 12, which would normally be the die of the stacked chip assembly most remote from the power source, is not restricted to receiving power through the multi-die connections, which eliminates voltage drops for power delivery that may otherwise limit either functionality or performance of the chip stack.

The through-hole 31 in the laminate substrate 32 of package 10*a* includes a conductive layer 74 that provides an electrically continuous path from surface 32*a* of the laminate substrate 32 to the opposite surface 32*b* of the laminate substrate 32. The conductive layer 74 may be a continuous coating that covers the sidewall 31*a* of the through-hole 31. The conductive layer 74 may be comprised of copper deposited by an electrochemical plating process, such as electroplating.

The conductive layer 74 may include a section 76, which may be ring-shaped, that is positioned on the surface 32*a* and that is coupled by specific solder balls 38*a* from among solder balls 38 with the die 20. The conductive layer 74 may include a section 78, which may be ring-shaped, that is positioned on the surface 32*b*. The conductive connection 64 couple the flange 55 of the lid 54 with the section 76 of the conductive layer 74. Power can be supplied directly from the power plane 70 in the printed circuit board 42 through the conductive layer 74 to die 20. Section 76 of the conductive layer 74 and section 78 of the conductive layer 74 may encircle the through-hole 31. The conductive layer 74 may be coupled with a power plane 62 of the laminate substrate 32 inside the through-hole 31.

To assemble the packages 10, 10*a*, the dies 12, 14, 16, 18 of similar dimensions may be stacked together to define a preliminary die stack and then the die stack including the dies 12, 14, 16, 18 may be stacked on to the larger die 20 to define a finished die stack. The dies 12, 14, 16, 18 are located on the same side of die 20 as the solder balls 38 used to attach die 20 to the laminate substrate 32. The die stack consisting of dies 12, 14, 16, 18, 20 is then inserted in the through-hole 31 of laminate substrate 32 and attached to the laminate substrate 32 with die 20 specifically soldered by reflowed solder balls 38 on to the top side of the laminate substrate 32. The lid 24 is then clamped and/or attached to the die 20 with the thermal interface material layer 26 dispensed between die 20 and the lid 24. The lid 24 is also connected to the surface 32*a* of the laminate substrate 32 at its periphery by conductive adhesive layer 37. The solder balls 44 are then attached to the surface 32*b* of the laminate substrate 32. The assembly is soldered onto the printed circuit board 42 by reflowing the solder balls 44. The heat sink 28 is then attached to lid 24 using thermal interface material layer 30.

For package 10*a*, the lid 54 is clamped and/or attached to the die 12 of the die stack from the one side of the through-hole 31 with the thermal interface material layer 60 disposed between the die 12 and the lid 54. The flange 55 of the lid 54 is also connected to the surface 32*b* of the laminate substrate 32 at the periphery of through-hole 31 with conductive connection 66, such as a conductive epoxy, to establish an electrical connection between the power plane 70 of the printed circuit board 42 and the power plane 62 of the laminate substrate 32. The thermal interface material layer 60 between the die 12 and the lid 54 is electrically conductive. Sections 76, 78 of conductive layer 74 may define plated power rings at the periphery of the through-hole 31 on both surfaces 32*a*, 32*b* of the laminate substrate 32, and are electrically connected to the power planes 62, 70. The conductive features 17 (e.g., TSVs) of die 12 extend to the exposed surface adjacent to the lid 54 to establish electrical connection with the lid 54 via the thermal interface material layer 60. After the assembly is soldered onto the printed circuit board 42 by reflowing the solder balls 44, the heat sink 54 is attached through the through-hole 61 in the printed circuit board 42 to the lid 54.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to or with another element, there are no intervening elements present. When an element is described as being "indirectly connected" or "indirectly coupled" to or with another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A package comprising:

a first lid;

a second lid;

a die stack including a first die and a second die stacked with the first die, the die stack located between the first lid and the second lid;

a first thermal interface material layer between the first lid and the first die; and a second thermal interface material layer between the second lid and the second die, the second thermal interface material layer comprised of a thermal interface material that has a high electrical conductivity and a high thermal conductivity.

2. The package of claim 1 further comprising:

a first substrate including a power plane and a power via coupled with the power plane, the power via accessible at a surface of the first substrate that is adjacent to the second lid; and an electrically-conductive connection coupling the second lid with the power via.

3. The package of claim 2 wherein the second lid includes pedestal and a flange that projects from the pedestal, and further comprising:

a second substrate including a through-hole in which the die stack and the pedestal of the second lid are positioned, wherein the flange of the second lid and the electrically-conductive connection are positioned in a gap between the first substrate and the second substrate.

4. The package of claim 2 wherein the second die includes a plurality of conductive features each extending through a thickness of the second die, and the second thermal interface material layer couples the second lid with the conductive features of the second die for receiving power from the power plane of the first substrate.

5. The package of claim 1 wherein the second lid includes pedestal and a flange that projects from the pedestal, and further comprising:

a substrate including a through-hole in which the die stack and the pedestal of the second lid are positioned.

6. The package of claim 5 wherein the first die is located proximate to a first end of the through-hole and the second die is located proximate to a second end of the through-hole, and further comprising:

a plurality of solder balls coupling the first die with the substrate.

7. The package of claim 1 further comprising:

a heat sink; and a third thermal interface material layer coupling the second lid with the heat sink.

8. A package comprising:

a first substrate including a first surface, a second surface, and a through-hole extending from the first surface to the second surface;

a conductive layer including a first portion on the first surface of the first substrate, a second portion on the second surface of the first substrate, and a third portion inside the through-hole, the first portion coupled with the second portion by the third portion;

a die stack including a first die and a second die stacked with the first die, the first die positioned adjacent to the first surface of the first substrate, and the first die coupled with the first portion of the conductive layer; and a second substrate adjacent to the second surface of the first substrate, the second substrate including a power plane coupled with the second portion of the conductive layer.

9. The package of claim 8 wherein the second die is positioned inside the through-hole in the first substrate, the first substrate is a laminate substrate, and the second substrate is a printed circuit board.

10. The package of claim 8 further comprising:

a lid coupling the second portion of the conductive layer with the second die.

11. The package of claim 10 wherein the second substrate includes a power via accessible at a surface of second substrate that is adjacent to the second surface of the first substrate, the power via coupled with the power plane, and further comprising:

a first electrically-conductive connection coupling the lid with the power via.

12. The package of claim 11 further comprising:

a second electrically-conductive connection coupling the lid with the second portion of the conductive layer.

13. The package of claim 10 further comprising:

a thermal interface material layer between the lid and the second die, the thermal interface material layer comprised of a thermal interface material that has a high electrical conductivity and a high thermal conductivity.

* * * * *